US012732678B2

(12) United States Patent
Brekerbohm

(10) Patent No.: US 12,732,678 B2
(45) Date of Patent: Sep. 8, 2026

(54) PELTIER MODULE, ASSEMBLY, AND APPARATUS FOR MASK INSPECTION

(71) Applicant: Carl Zeiss SMT GmbH, Oberkochen (DE)

(72) Inventor: Lutz Brekerbohm, Hardegsen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 53 days.

(21) Appl. No.: 18/594,171

(22) Filed: Mar. 4, 2024

(65) Prior Publication Data

US 2024/0298082 A1 Sep. 5, 2024

(30) Foreign Application Priority Data

Mar. 3, 2023 (DE) ......................... 102023201942.6

(51) Int. Cl.

| | |
|---|---|
| ***H04N 23/52*** | (2023.01) |
| ***G03B 17/55*** | (2021.01) |
| ***H04N 23/54*** | (2023.01) |
| ***H10F 39/00*** | (2025.01) |
| ***H10W 40/28*** | (2026.01) |

(52) U.S. Cl.

CPC ............. *H04N 23/52* (2023.01); *H04N 23/54* (2023.01); *H10F 39/804* (2025.01); *H10W 40/28* (2026.01); *G03B 17/55* (2013.01)

(58) Field of Classification Search

CPC ........ H04N 23/50; H04N 23/51; H04N 23/52; H04N 23/54; H04N 23/55; H04N 23/57; H01L 23/38; H10F 39/804; G03B 17/55

USPC .......................................................... 136/203

See application file for complete search history.

(56) References Cited

U.S. PATENT DOCUMENTS

| | | | | |
|---|---|---|---|---|
| RE35,441 E | 2/1997 | Yokotani et al. | | |
| 2005/0073815 A1* | 4/2005 | Hirano | H04N 23/51 348/E5.026 |
| 2009/0244530 A1 | 10/2009 | Iida et al. | |
| 2013/0107239 A1* | 5/2013 | Clauss | B82Y 10/00 355/71 |

(Continued)

FOREIGN PATENT DOCUMENTS

| | | |
|---|---|---|
| DE | 41 01 644 | 7/1992 |
| DE | 102020211359 | 3/2022 |
| DE | 102022133829 | 6/2024 |

(Continued)

OTHER PUBLICATIONS

Office Action issued by the Japanese Patent Office for Application No. JP 2024-030986, dated Mar. 10, 2025 (with English Translation).

(Continued)

*Primary Examiner* — Twyler L Haskins
*Assistant Examiner* — Akshay Trehan
(74) *Attorney, Agent, or Firm* — Fish & Richardson P.C.

(57) ABSTRACT

The invention relates to a Peltier module, to an assembly and to an apparatus for mask inspection. A Peltier module according to the invention has a plurality of Peltier pellets, which are made of a semiconductor material and are arranged between a first plate forming a hot side and a second plate forming a cold side, wherein the first plate and the second plate are each made of a metallic material, and wherein a vacuum seal component is provided on the second plate.

18 Claims, 4 Drawing Sheets

(56) References Cited

U.S. PATENT DOCUMENTS

| | | | | |
|---|---|---|---|---|
| 2014/0356985 | A1* | 12/2014 | Ricci | C23C 16/4586 118/712 |
| 2024/0302290 | A1 | 9/2024 | Brekerbohm et al. | |

FOREIGN PATENT DOCUMENTS

| | | | | | |
|---|---|---|---|---|---|
| EP | 0 712 537 | | | 11/2000 | |
| JP | 2002-54855 | | | 2/2002 | |
| JP | 2007-220801 | | | 8/2007 | |
| JP | 2007220801 | A | * | 8/2007 | H01L 21/027 |
| JP | 2009-244155 | | | 10/2009 | |
| JP | 2013-095659 | | | 5/2013 | |
| JP | 2015-008287 | | | 1/2015 | |
| JP | 2015-135932 | | | 7/2015 | |
| JP | 2015135932 | A | * | 7/2015 | H01L 35/30 |
| JP | 2017-147267 | | | 8/2017 | |
| JP | 2017147267 | A | * | 8/2017 | H01L 35/30 |
| JP | 2019-200277 | | | 11/2019 | |
| JP | 2019200277 | A | * | 11/2019 | G03F 1/84 |
| TW | I222668 | B | | 10/2004 | |
| TW | 201511174 | | | 3/2015 | |
| WO | WO-2003054936 | | * | 7/2003 | G03F 7/70866 |
| WO | WO 2009/135539 | | | 11/2009 | |
| WO | WO-2009135539 | A1 | * | 11/2009 | H04N 23/57 |
| WO | WO 2024/132443 | | | 6/2024 | |

OTHER PUBLICATIONS

Office Action and Search Report issued by the Taiwan Patent Office for Application No. TW 113107176, dated Mar. 17, 2025 (with English Translation).

Office Action issued by the German Patent Office for Application No. DE 10 2023 201 942.6, dated Oct. 18, 2023 (with English Translation).

Office Action and Search Report in Taiwanese Appln. No. 113107176, mailed on Sep. 30, 2025, 21 pages (with English translation).

* cited by examiner 100
120
121
122
123
124
125
126
127
128

PELTIER MODULE, ASSEMBLY, AND APPARATUS FOR MASK INSPECTION

CROSS-REFERENCE TO RELATED APPLICATION

The present application claims priority under 35 U.S.C. § 119 to German Application DE 10 2023 201 942.6, filed on Mar. 3, 2023, the entire content of which is incorporated herein by reference.

TECHNICAL FIELD

The invention relates to a Peltier module, to an assembly and to an apparatus for mask inspection.

BACKGROUND

In practice, for example in optical systems which are designed for operation in the EUV range and are equipped with one or more image sensors, there is a demand for the efficient dissipation of heat generated during operation at the image sensor, while at the same time avoiding any impairment of the vacuum present in the optical system. Known approaches include the use of cooling channels, through which a cooling fluid can flow in each case, but this is accompanied by a limited cooling performance, a possibly insufficient accuracy in the setting of specified temperature setpoints and a complex handling of the required cooling fluid connections under the given vacuum conditions.

For actively cooling components or component parts, the use of Peltier modules, which are arranged, as a plurality of pellets, for example between two ceramic plates, one of which forms the hot side and the other forms the cold side of the Peltier module, is also known in principle architecture and control scheme. However, under vacuum (and especially EUV) conditions, the use of such Peltier modules proves to be problematic regarding contamination aspects, wherein the efficiency or cooling performance may also be insufficient. However, since the performance of an image sensor, for example in the application scenario of mask inspection, is substantially determined by the operating temperature, insufficient cooling is accompanied by an impairment of the performance of the image sensor or the associated optical system, and maintaining proper operation while at the same time maintaining vacuum conditions is highly challenging in practice.

Microlithography is used for producing microstructured components, such as for example integrated circuits or LCDs. The microlithography process is conducted in what is called a projection exposure apparatus, which comprises an illumination device and a projection lens The image of a mask (=reticle) illuminated by use of the illumination device is projected here by use of the projection lens onto a substrate (e.g., a silicon wafer) that is coated with a light-sensitive layer (photoresist) and arranged in the image plane of the projection lens, in order to transfer the mask structure onto the light-sensitive coating of the substrate.

Unwanted defects on the mask have a particularly disadvantageous effect in the lithography process as these defects may be reproduced in each exposure step and hence, in a worst-case scenario, there is the risk of the entire output of semiconductor components being unusable. Therefore, it is very important to check the mask has a sufficient imaging capability prior to the use thereof within the scope of mass production. Mask inspection apparatuses are used to reliably test the mask quickly and easily, if possible under conditions similar to those that are actually present in the projection exposure apparatus. Mask inspection apparatuses in turn comprise an illumination system and a projection lens, with the illuminated region of the mask being imaged onto an image sensor arrangement such as, e.g., a CCD camera by use of the projection lens.

SUMMARY

Against the above background, it is a general aspect of the present invention to provide a Peltier module, an assembly and an apparatus for mask inspection, wherein efficient dissipation of heat generated during operation is enabled, while at least partly avoiding the problems described above.

This general aspect is achieved according to the features of the independent claims.

According to one aspect, the invention relates to a Peltier module comprising

- a plurality of Peltier pellets, which are made of a semiconductor material and are arranged between a first plate forming a hot side and a second plate forming a cold side;
- wherein the first plate and the second plate are each made of a metallic material; and
- wherein a vacuum seal component is provided on the second plate.

The invention is based in particular on the concept of using a Peltier module for actively cooling an image sensor or camera chip, in particular for use in an optical system designed for operation in the EUV wavelength range with a corresponding vacuum, such as an apparatus for mask inspection, and for this purpose to design the Peltier module "metal-based" (i.e., by making the plates forming the cold side and the hot side of the Peltier module of a metallic material) and, in addition, to design the cold side of the Peltier module or the corresponding plate directly as a "vacuum part," which enables sealing of the (EUV) vacuum of the optical system, which ultimately receives the image sensor.

Making the plates that form the hot side and cold side (and receive the Peltier pellets between them) of a metallic material enables an improved cooling performance (e.g., of more than 20 W/cm$^2$) and also direct machining for mounting purposes (in particular for the targeted adaptation to a customer-specific application scenario).

The design of the second plate forming the cold side as a "vacuum part" is realized according to the invention by using a suitable vacuum-suitable material (e.g., aluminium, Al) and by the fact that a vacuum seal component (i.e. the preparation of a vacuum seal, e.g., by incorporating a groove for an O-ring seal) is already provided on the relevant second plate forming the cold side. In embodiments of the invention, the second plate already forms a mounting interface for the respective image sensor or image sensor carrier and can be configured for this purpose, for example, with one or more fastening holes for fastening the image sensor carrier.

The Peltier module according to the invention can also be used in embodiments to achieve active cooling, e.g., of an image sensor below the ambient temperature, in particular in the sense of closed-loop temperature control.

According to one embodiment, the material of the second plate is a material suitable for operation in ultra-high vacuum or at a partial pressure of less than $10^{-5}$ pascals.

In embodiments, the material of the second plate may also be a material suitable for operation at partial pressures of special atmospheres of less than 10 pascals, preferably less than 5 pascals. In further embodiments, the material of the second plate can also be a material suitable for operation at a partial pressure of less than $10^{-7}$ pascals. In particular, the material of the second plate may be, e.g., aluminium (Al) and/or a stainless steel alloy suitable for EUV. Further suitable materials are vacuum-capable ceramics.

According to one embodiment, the second plate is designed as a mounting interface for an image sensor or image sensor carrier.

According to one embodiment, the second plate has at least one fastening contour, in particular at least one fastening hole, for fastening the image sensor carrier. Other fastening contours such as grooves are also possible.

The invention also further relates to an assembly comprising

- a Peltier module having a plurality of Peltier pellets, which are made of a semiconductor material and are arranged between a first plate forming a hot side and a second plate forming a cold side, wherein the first plate and the second plate are each made of a metallic material; and
- an image sensor carrier and/or image sensor fastened to the second plate.

According to one embodiment, the Peltier module is designed with the features described above.

According to one embodiment, a heat dissipation block for dissipating heat generated during operation on the hot side is arranged on the first plate.

According to one embodiment, a vacuum seal between a vacuum present in the region of the image sensor and an ambient atmosphere present in the region of the hot side is provided by the second plate.

According to one embodiment, a closed-loop control unit for controlling the temperature of the image sensor is also provided. In particular, temperatures below the ambient temperature can also be realized.

The invention also further relates to an apparatus for mask inspection, wherein the mask is intended to be illuminated in a lithography process in a projection exposure apparatus for exposing a wafer, wherein the apparatus comprises an illumination system, a projection lens and a sensor arrangement with at least one image sensor, wherein a Peltier module with the features described above is provided for cooling this at least one image sensor.

According to one embodiment, the mask is designed for operation in reflection at an operating wavelength of less than 30 nm.

Further configurations of the invention are apparent from the description and the dependent claims.

Below, the invention is explained in more detail on the basis of preferred exemplary embodiments, with reference being made to the attached drawings.

DETAILED DESCRIPTION

Figure 1:
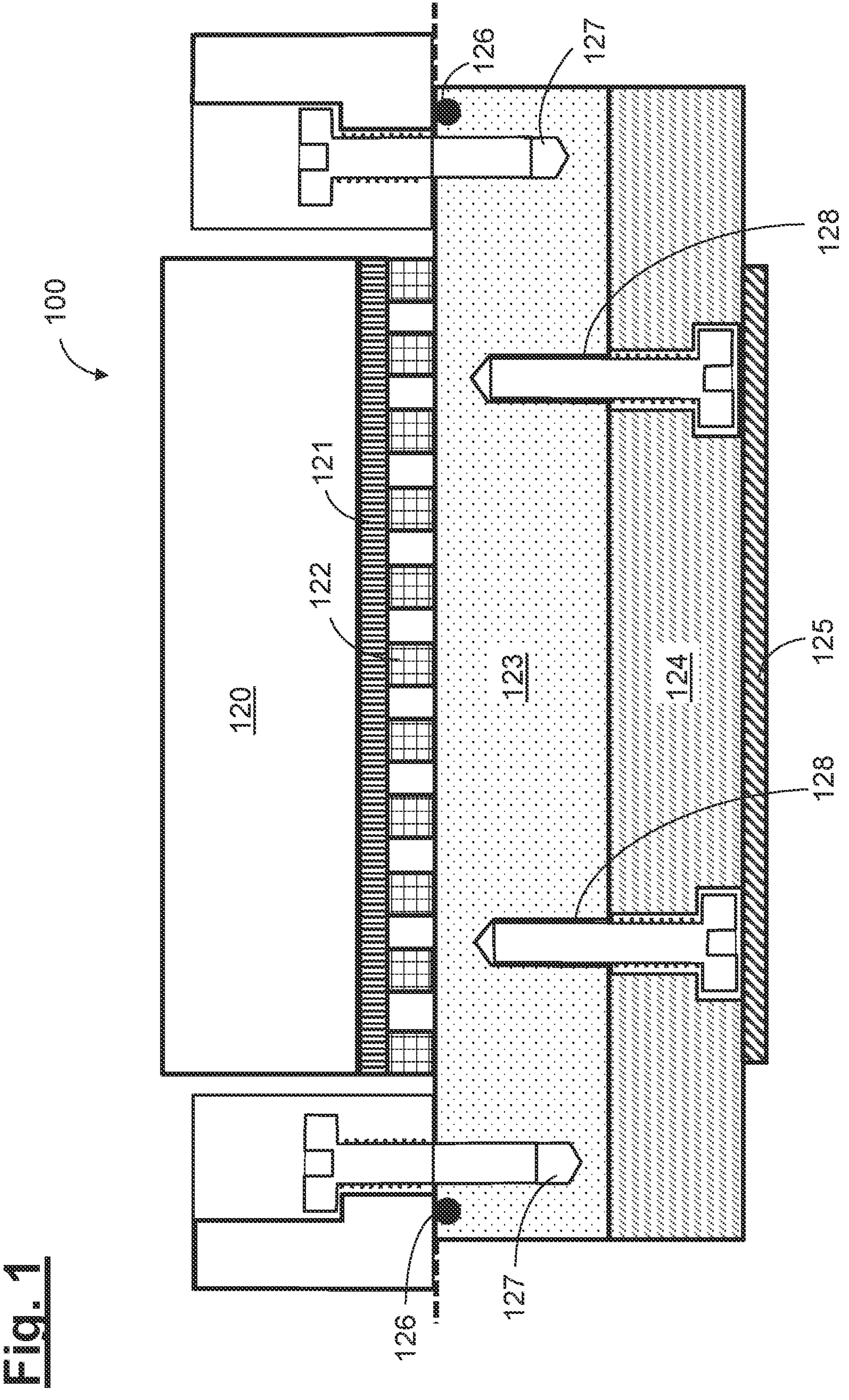
FIG. 1 shows a schematic illustration of the construction of an assembly according to the invention with a Peltier module that is possible in principle.

FIG. 1 shows, merely in a schematic illustration, the possible construction of an assembly 100 having a Peltier module according to the invention in an embodiment of the invention.

According to FIG. 1, the Peltier module according to the invention initially comprises in a manner known per se a plurality of Peltier pellets 122, which are made of a semiconductor material (for example bismuth telluride, $Bi_2Te_3$) and are arranged between a first plate 121 forming a hot side of the Peltier module and a second plate 123 forming a cold side of the Peltier module. The first plate 121 and the second plate 123 are made, according to the invention, of a metallic material, in particular aluminium (Al).

"120" refers to a heat dissipation block mechanically coupled to the first plate 121 forming the hot side, through which the heat generated during operation on the hot side is dissipated to the outside. The second plate 123 forming the cold side is designed, according to the invention, as a mounting interface for an image sensor carrier 124 and for this purpose has corresponding fastening boles 128 at suitable positions in the embodiment shown. "127" denotes a fastening connection for fastening the assembly 100 to the environment. "125" refers to an image sensor carried by the image sensor carrier 124 or to a camera chip, which is located in the (EUV) vacuum of an optical system in the specific application scenario. For example, the image sensor can be a charge-coupled device (CCD) sensor or a complementary metal-oxide-semiconductor (CMOS) sensor. The image sensor can include an array of sensor elements.

In the assembly according to the invention, the second plate 123 providing the cold side of the Peltier module serves as a "vacuum part,"—at which the necessary sealing between the EUV vacuum present in the region of the image sensor 125 and the ambient atmosphere present on the hot side is realized. In addition, the second plate 123 providing the cold side of the Peltier module also serves as a mounting interface to which the image sensor 125 or the associated image sensor carrier 124 is mechanically fixed directly (e.g. using fastening screws and/or adhesive).

As a result, the image sensor 125 is actively cooled during operation of the associated optical system in this way, wherein at the same time an impairment of the (EUV) vacuum present in the optical system or on the side of the image sensor is avoided.

The optical system may be in particular an apparatus for mask inspection, the construction of which that is possible in principle is described in the following text with reference to the merely schematic illustration of FIG. 2.

Figure 2:
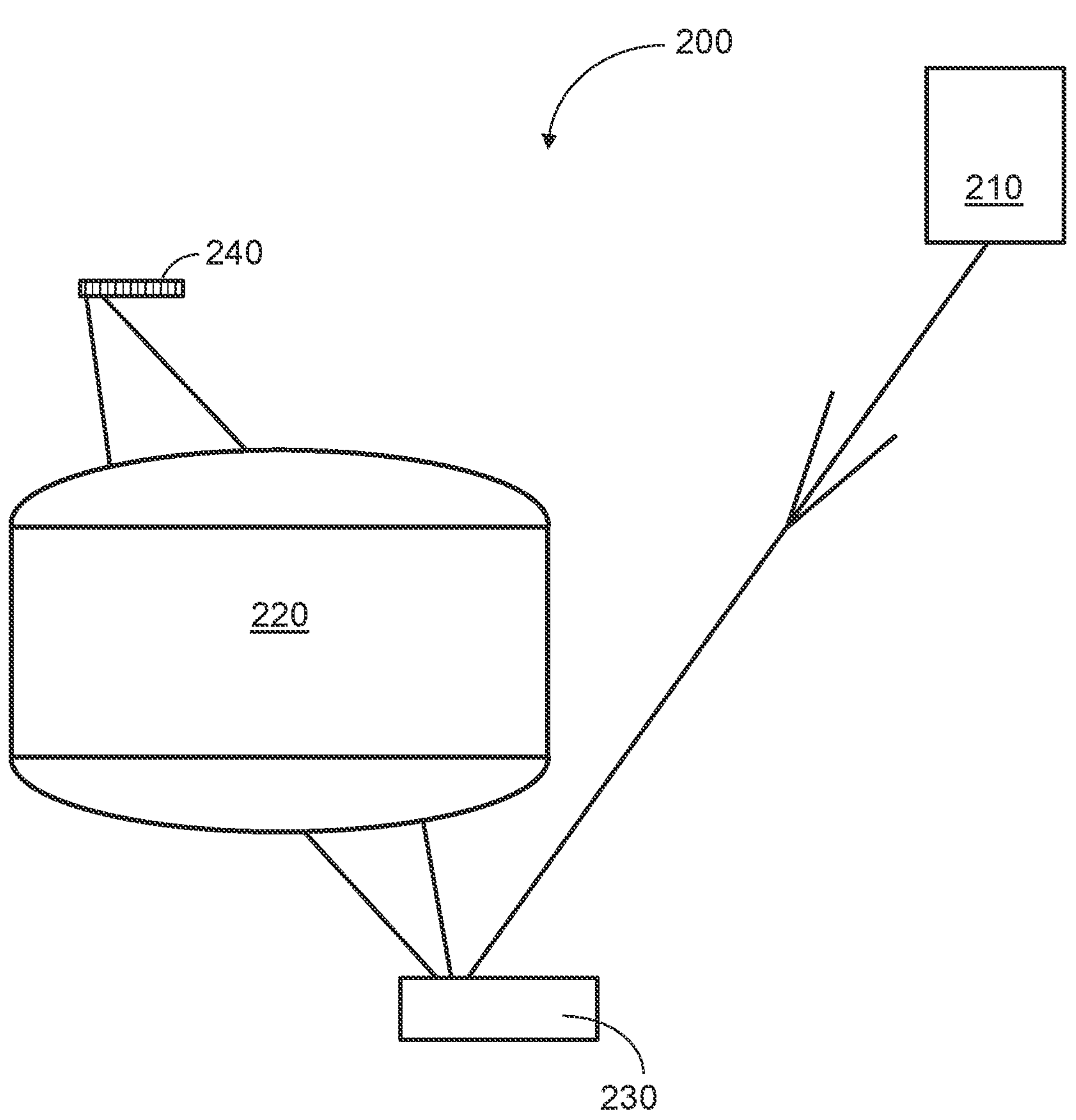
FIG. 2 shows a schematic illustration of the structure of an apparatus for mask inspection that is possible in principle as a possible application scenario of the present invention.

According to FIG. 2, an apparatus 200 for mask inspection comprises an illumination system 210 and a projection lens 220, wherein light from a light source (not shown in FIG. 2) enters the illumination system 210 and is incident on a mask 230 arranged in the object plane of the projection lens 220, and wherein the illuminated region of the mask 230 is imaged by use of the projection lens onto a sensor arrangement 240. The sensor arrangement 240 may in particular have an image sensor which is equipped according to the invention, as described above with reference to FIG. 1, with a Peltier module for heat dissipation or also for active closed-loop temperature control.

Figure 3:
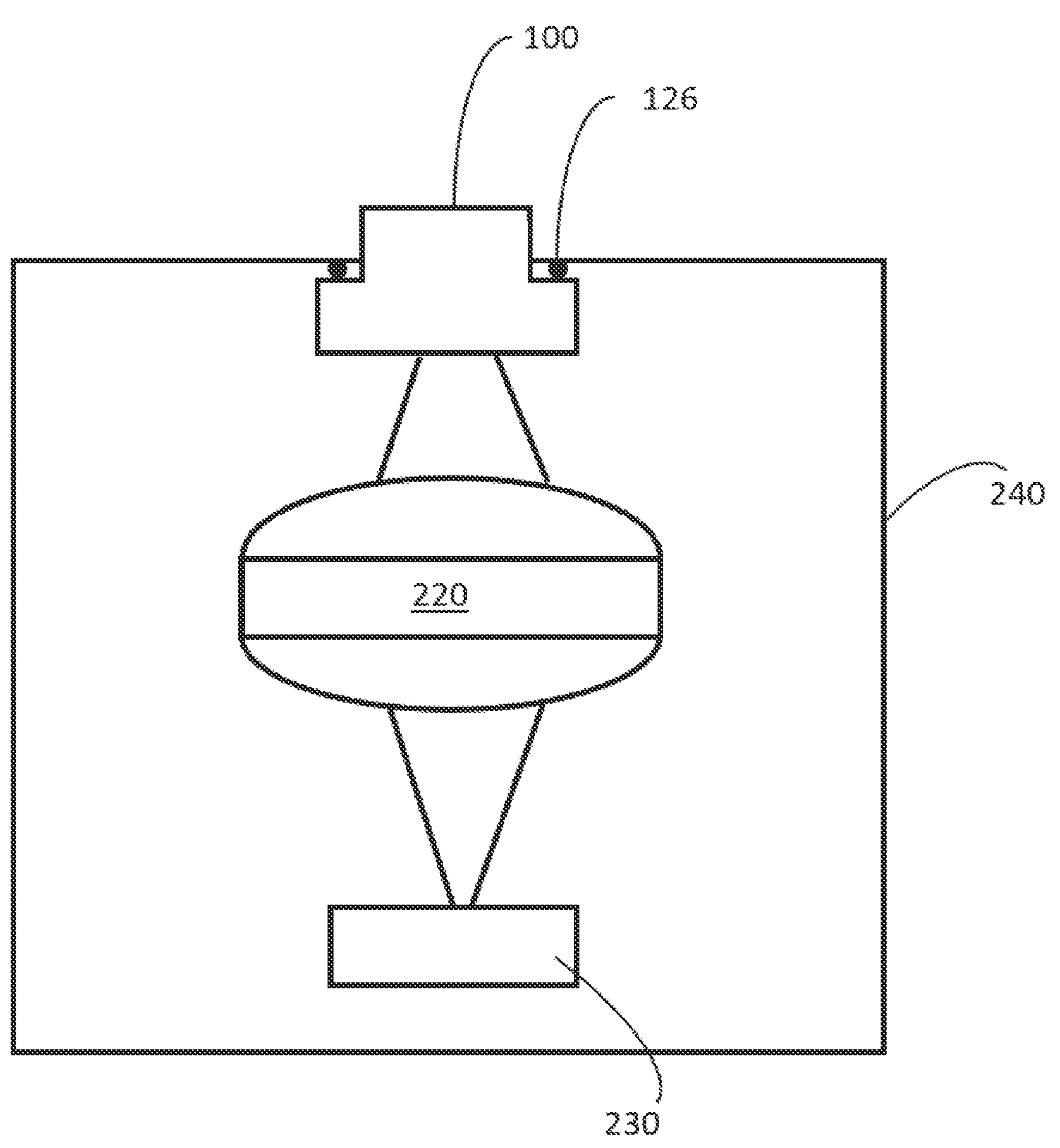
FIG. 3 shows a schematic illustration illustrating in particular a vacuum seal component providing a vacuum seal.

FIG. 3 schematically shows a vacuum chamber 240, in which the projection lens 220 and the mask 230 are arranged. FIG. 3 also schematically shows the assembly 100 and in particular the vacuum seal component 126 providing a vacuum seal.

Figure 4:
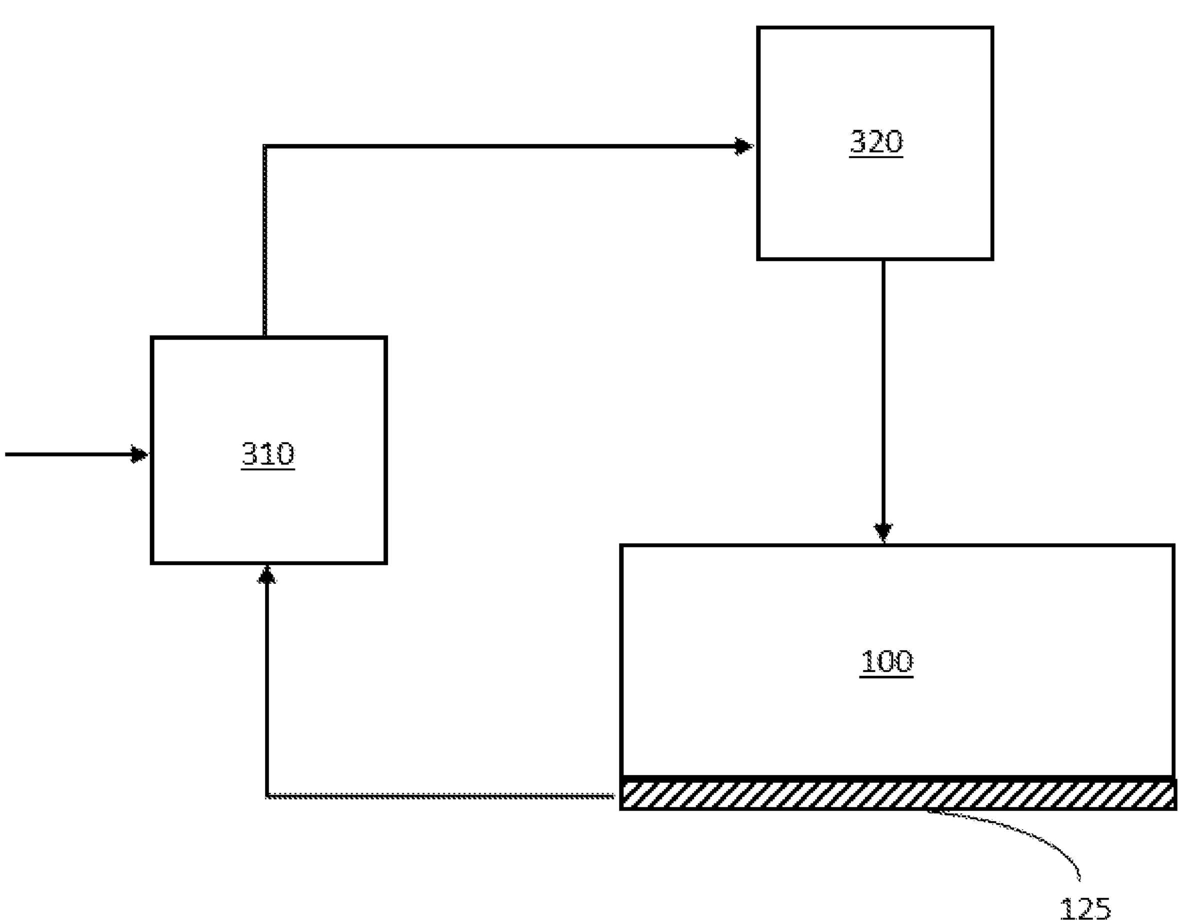
FIG. 4 shows a schematic illustration of a temperature control unit receiving temperature information of an image sensor and generating a control signal for a Peltier module power supply.

According to FIG. 4, a temperature control unit 310 receives temperature information of image sensor 125 and generates a control signal for a Peltier module power supply 320 according to the temperature setpoint deviation. The supplied electrical power is modified respectively.

In some implementations, the temperature control unit 310 can include an error detector that compares the temperature information of image sensor 125 with a reference input (setpoint) and outputs an error signal, and control circuitry that generates the control signal for the Peltier module power supply 320 based on the error signal. The control circuitry can include circuitry for controlling one or more parameters, such as loop gain. The temperature control unit 310 can include a storage device to store program code, reference values, and measurement values, an analog-to-digital converter to convert input analog signals to digital signals, a microprocessor to perform arithmetic calculations, and a digital-to-analog converter to convert digital output signals to analog output signals. The temperature control unit 310 can include a user interface for an operator to control and monitor the operations of the unit, including adjusting the temperature setpoint values.

In order to make a prediction of the imaging result obtained with a mask when the lithography process is carried out in a projection exposure apparatus, initially the measurement of an intensity distribution obtained for the mask in the apparatus for mask inspection of FIG. 2 or with the sensor arrangement takes place. Here, the same wavelength is preferably used in the mask inspection system that is also used during the lithography process in the projection exposure apparatus.

Even though the invention has also been described on the basis of specific embodiments, numerous variations and alternative embodiments will be apparent to a person skilled in the art, for example by the combination and/or exchange of features of individual embodiments. Accordingly, it goes without saying for a person skilled in the art that such variations and alternative embodiments are also encompassed by the present invention, and the scope of the invention is restricted only within the meaning of the appended claims and the equivalents thereof.

What is claimed is:

1. A Peltier module, comprising a plurality of Peltier pellets, which are made of a semiconductor material and are arranged between a first plate forming a hot side and a second plate forming a cold side;

wherein the second plate is designed as a mounting interface for an image sensor or image sensor carrier;

wherein the first plate and the second plate are each made of a metallic material;

wherein a vacuum seal component is provided on the second plate; and wherein the second plate has at least one fastening hole for fastening the image sensor carrier to the second plate.

2. The Peltier module of claim 1, wherein the material of the second plate is a material suitable for operation at a partial pressure of less than $10^{-5}$ pascals.

3. The Peltier module of claim 2, wherein the second plate is designed as a mounting interface for an image sensor or image sensor carrier.

4. The Peltier module of claim 1, wherein the second plate has at least one fastening contour for fastening the image sensor carrier to the second plate.

5. An apparatus for inspection of a mask, wherein the mask is intended to be illuminated in a lithography process in a projection exposure apparatus for exposing a wafer, wherein the apparatus comprises an illumination system, a projection lens and a sensor arrangement with at least one image sensor, wherein the Peltier module of claim 1 is provided for cooling this at least one image sensor.

6. The apparatus of claim 5, wherein the mask is designed for operation in reflection at an operating wavelength of less than 30 nm.

7. The apparatus of claim 5, wherein the material of the second plate is a material suitable for operation at a partial pressure of less than 10-5 pascals.

8. The apparatus of claim 5, wherein the second plate is designed as a mounting interface for an image sensor or image sensor carrier.

9. An assembly comprising a Peltier module having a plurality of Peltier pellets, which are made of a semiconductor material and are arranged between a first plate forming a hot side and a second plate forming a cold side, wherein the first plate and the second plate are each made of a metallic material; and an image sensor carrier and/or image sensor fastened to the second plate;

wherein the second plate has at least one fastening hole for fastening the image sensor carrier to the second plate.

10. The assembly of claim 9, wherein a vacuum seal component is provided on the second plate.

11. The assembly of claim 7, comprising a heat dissipation block arranged on the first plate, wherein the heat dissipation block is configured to dissipate heat generated on the hot side during operation.

12. The assembly of claim 10, comprising the image sensor fastened to the second plate, wherein the second plate is configured to provide a vacuum seal between a vacuum present in the region of the image sensor and an ambient atmosphere present in the region of the hot side.

13. The assembly of claim 10, further comprising a closed-loop control unit configured to control the temperature of the image sensor.

14. The assembly of claim 9, wherein a heat dissipation block for dissipating heat generated on the hot side during operation is arranged on the first plate.

15. The assembly of claim 14, comprising the image sensor fastened to the second plate, wherein the second plate is configured to provide a vacuum seal between a vacuum present in the region of the image sensor and an ambient atmosphere present in the region of the hot side.

16. The assembly of claim 14, further comprising a closed-loop control unit configured to control the temperature of the image sensor.

17. The assembly of claim 9, wherein a vacuum seal between a vacuum present in the region of the image sensor and an ambient atmosphere present in the region of the hot side is provided by the second plate.

18. The assembly of claim 9, further comprising a closed-loop control unit for controlling the temperature of the image sensor.

* * * * *